United States Patent [19]

Ohno et al.

[11] Patent Number: 4,882,712
[45] Date of Patent: Nov. 21, 1989

[54] SYNCHRONOUS SEMICONDUCTOR MEMORY DEVICE

[75] Inventors: Chikai Ohno; Michiyuki Hirata, both of Kasugai, Japan

[73] Assignees: Fujitsu Limited, Kawasaki; Fujitsu VLSI Limited, Kasugai, both of Japan

[21] Appl. No.: 249,058

[22] Filed: Sep. 26, 1988

[30] Foreign Application Priority Data

Sep. 29, 1987 [JP] Japan .................................. 62-244695

[51] Int. Cl.$^4$ ............................................. G11C 11/40
[52] U.S. Cl. ................................. 365/206; 365/189.05; 365/230.01
[58] Field of Search .............. 365/206, 189.01, 189.05, 365/230.01

[56] References Cited

U.S. PATENT DOCUMENTS 4,796,234  1/1989  Itoh et al. ...................... 365/189.05

Primary Examiner—Terrell W. Fears
Attorney, Agent, or Firm—Armstrong, Nikaido, Marmelstein, Kubovcik & Murray

[57] ABSTRACT

A synchronous semiconductor memory device has a noise preventing part for preventing a noise from being transmitted to a memory cell array, where the noise is caused by a change in a write data.

9 Claims, 8 Drawing Sheets

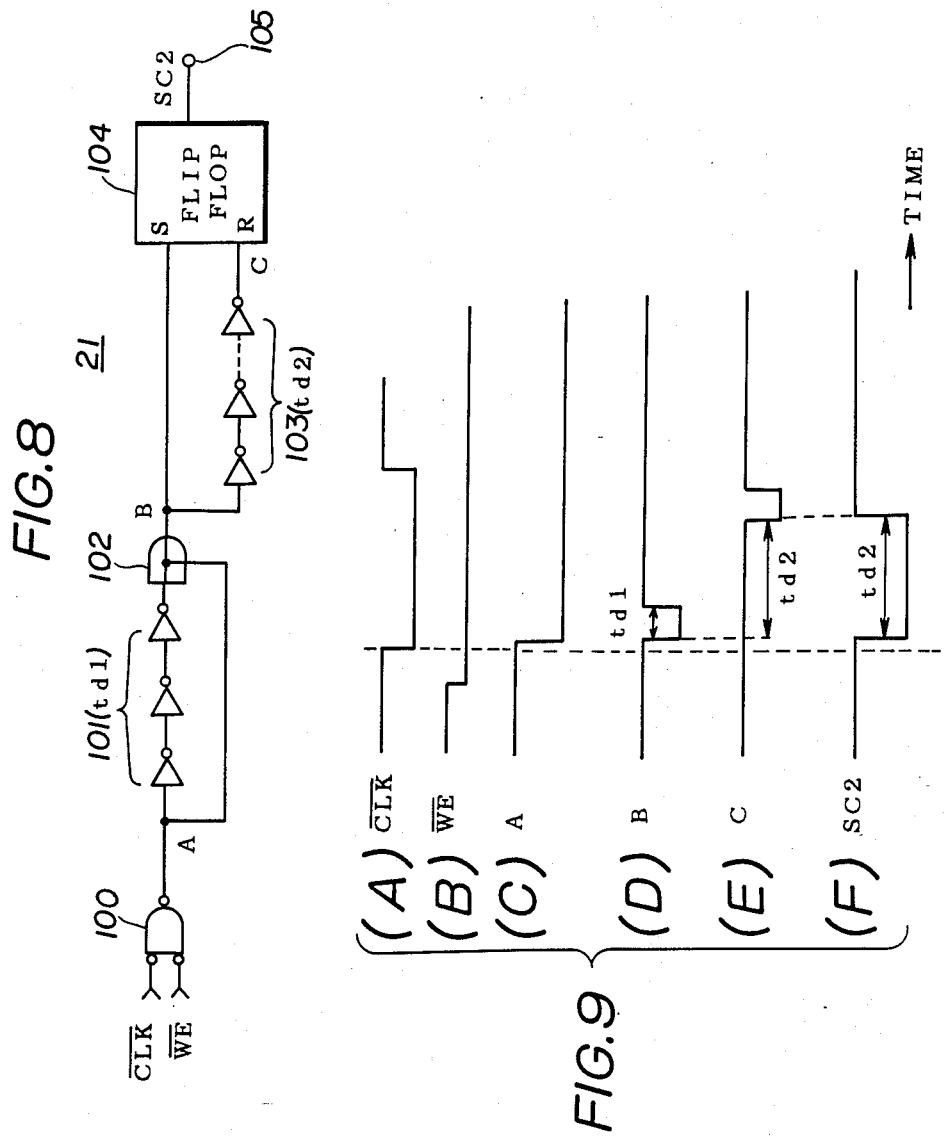

SYNCHRONOUS SEMICONDUCTOR MEMORY DEVICE

BACKGROUND OF THE INVENTION

The present invention generally relates to semiconductor memory devices, and more particularly to a synchronous semiconductor memory device such as a synchronous random access memory having latch circuits for receiving a write data and a write command.

FIG. 1 shows an example of a conventional asynchronous random access memory (RAM). The RAM generally has a write command input buffer circuit 1 for receiving an external write command (write enable signal) $\overline{WE}$, a write data input buffer circuit 2 for receiving a write data DIN, a write control circuit 3, a level shift circuit 4, and a memory cell array 5 having a plurality of memory cells MC. GND and $V_{EE}$ denote power source voltages, and VR1 and VR2 denote reference voltages. The write control circuit 3 supplies the write data DIN to the memory cell array 5 in a write mode. In a read mode, the write control circuit 3 cuts off the supply of the write data DIN and applies a constant read potential to the memory cell array 5. The write and read modes are controlled by the write command $\overline{WE}$, and the write mode is selected by a low-level write command $\overline{WE}$ and the read mode is selected by a high-level write command $\overline{WE}$. An output signal of the input buffer circuit 1 which receives the write command $\overline{WE}$ is applied to transistors $Q_{32}$ and $Q_{34}$ of the write control circuit 3.

A transistor Qa for cancelling a noise is connected to the input buffer circuits 1 and 2 as indicated by a phantom line in FIG. 1. During a time other than a write process, a change in the write data DIN becomes a source of the noise and the noise would be transmitted to the write control circuit 3 if the transistor Qa were not provided. In this case, the noise would destroy an information content of the memory cell MC through the write control circuit 3. Hence, the transistor Qa has a function of clamping a potential of a write process signal so as to prevent the noise from destroying the information content of the memory cell MC.

FIGS. 2(A) through 2(F) are time charts for explaining the operation of the conventional asynchronous RAM with and without the transistor Qa for cancelling the noise. FIGS. 2(A) and 2(B) respectively show the write data DIN and the write command $\overline{WE}$. FIGS. 2(C) and 2(D) respectively show write process signals Sa1 and Sb1 at nodes A1 and B1 in FIG. 1 then the transistor Qa is not provided, while FIGS. 2(E) and 2(F) respectively show write process signals Sa2 and Sb2 at the nodes A1 and B1 when the transistor Qa is provided. In FIGS. 2(C) and 2(D), N1 denotes a source of the noise introduced in the write process signals Sa1 and Sb1 due to a change in the write data DIN.

The node A1 is connected to a base of a transistor $Q_{33}$ of the write control circuit 3 to which the write process signal Sa1 or Sa2 is supplied. The node B1 is connected to a base of a transistor $Q_{31}$ of the write control circuit 3 to which the write process signal Sb1 or Sb2 is supplied.

When the transistor Qa is not provided in FIG. 1, the write process signals Sa1 and Sb1 outputted from the input buffer 2 and supplied to the write control circuit 3 through the respective nodes A1 and B1 change when the write data DIN changes, regardless of whether the RAM is in the write mode or the read mode. For this reason, the change in the write data DIN in the read mode causes a change in the write process signals Sa1 and Sb1 at the respective nodes A1 and B1 and becomes a source of a noise with respect to the write control circuit 3. On the other hand, in the read mode, the write control circuit 3 applies a constant read potential to the memory cell array 5. Thus, the noise source N1 shown in FIGS. 2(C) and 2(D) varies the read potential in the read mode and makes undesirable effects on the memory cells MC of the memory cell array 5.

In other words, the noise in the read potential becomes a noise in a detecting potential for detecting the information content of the memory cell MC on a bit line BL which is coupled to the ground through a transistor Tr. Accordingly, the noise deteriorates the access time of the RAM and in an extreme case the information content of the memory cell MC is inverted thereby causing an erroneous write operation.

In order to eliminate the above described problems, the conventional asynchronous RAM uses the transistor Qa to clamp the change in the write data DIN at an input stage of the input buffer 2. A base of the transistor Qa is controlled by the write command $\overline{WE}$ from the input buffer 1. In the read mode, the transistor Qa substantially fixes the write data DIN to a high level responsive to a high-level write command $\overline{WE}$. In this case, the potential change in the write process signals Sa2 and Sb2 respectively shown in FIGS. 2(E) and 2(F) only occurs during a low-level period of the write command $\overline{WE}$ in the write cycle, that is, only in the write mode, and the potentials of the write process signals Sa2 and Sb2 are otherwise fixed regardless of the change in the write data DIN. Therefore, it is possible to completely eliminate the source of the noise with respect to the write control circuit 3 caused by the change in the write data DIN.

On the other hand, there is a conceivable synchronous RAM shown in FIG. 3 which has latch circuits and controls the external write command $\overline{WE}$ and the write data DIN responsive to a clock signal CLK. But even when the transistor Qa is connected to the synchronous RAM shown in FIG. 3, it is impossible to eliminate the problem of the noise caused by the change in the write data DIN.

In FIG. 3, the synchronous RAM generally has a write command input latch circuit 6 for receiving the write command $\overline{WE}$, a write data input latch circuit 7 for receiving the write data DIN, a write control circuit 8, a write pulse generating circuit 9 for generating an internal write pulse signal, and a clock gate circuit 10 for outputting to the write pulse generating circuit 9 a start signal for starting the generation of the internal write pulse signal based on a clock signal CLK and the write command $\overline{WE}$. GND and $V_{EE}$ denote power source voltages, and VR1, VR2 and VR3 denote reference voltages. The write control circuit 8 supplies the write data DIN to the memory cell array (not shown) in the write mode. On the other hand, in the read mode, the write control circuit 8 cuts off the supply of the write data DIN and applies a constant read potential to the memory cell array. The transistor Qa is connected as indicated by a phantom line in FIG. 3.

FIGS. 4(A) through 4(H) are time charts for explaining the operation of the conceivable synchronous RAM with and without the transistor Qa for cancelling the noise. FIGS. 4(A), 4(B), 4(C) and 4(D) respectively show the clock signal CLK, the write data DIN, the write command $\overline{WE}$ and a signal SC1 at a node C1. $t_S$ denotes a set up time and $t_H$ denotes a hold time of the latch circuit 6. The signal SC1 at the node C1 is the internal write pulse signal outputted from the write pulse generating circuit 9. This internal write pulse signal SC1 is applied to bases of transistors $Q_{82}$ and $Q_{84}$ of the write control circuit 8.

FIGS. 4(E) and 4(F) respectively show write process signals Sa3 and Sb3 at nodes A2 and B2 in FIG. 3 when the write command $\overline{WE}$ has a waveform indicated by 1 in FIG. 4(C), while FIGS. 4(G) and 4(H) respectively show write process signals Sa4 and Sb4 at the nodes A2 and B2 when the write command $\overline{WE}$ has a waveform indicated by 2 in FIG. 4(C). In FIGS. 4(G) and 4(H), N2 and N3 respectively denote a source of the noise introduced in the write process signals Sa4 and Sb4 due to a change in the write data DIN. The write process signals Sa3, Sb3, Sa4 and Sb4 are internal write data signals formed depending on the write data DIN applied to the input latch circuit 7. The node A2 is connected to a base of a transistor $Q_{83}$ of the write control circuit 8, and the write process signal Sa3 or Sa4 is applied to the base of the transistor $Q_{83}$. The node B2 is connected to a base of a transistor $Q_{81}$ of the write control circuit 8, and the write process signal Sb3 or Sb4 is applied to the base of the transistor $Q_{81}$.

Next, a description will be given on why the noise cannot be eliminated in the conceivable synchronous RAM even when the transistor Qa is provided as shown in FIG. 3.

In FIG. 4(C), the setting with respect to the write command $\overline{WE}$ of the synchronous RAM is made so that the write command $\overline{WE}$ is "true" only during a time $[t_S(min) + t_H(min)]$ because the latch circuit 6 has the data store function, where $t_H(min)$ is the minimum hold time and $t_S(min)$ is the minimum set up time with respect to the rising edge of the clock signal CLK. In other words, the write or read mode within one cycle of the clock signal CLK is determined by the high or low level state of the write command $\overline{WE}$ at the rising edge of the clock signal CLK. Accordingly, the condition on the write command $\overline{WE}$ is that the write command $\overline{WE}$ is fixed to the high or low level at least during the time $t_S(min)$ before the rising edge of the clock signal CLK and the time $t_H(min)$ after the rising edge of the clock signal CLK. Thus, the write command $\overline{WE}$ may change during a time other than the time $[t_S(min) + t_H(min)]$ and such a chage will not be an effective signal against the write or read operation.

Therefore, in a first case, the write command $\overline{WE}$ becomes low immediately before the write cycle (that is, the minimum set up time $t_S(min)$ before the rising edge of the clock signal CLK) and ends the minimum hold time $t_H(min)$ after the rising edge of the clock signal CLK as indicated by the solid line 1 in FIG. 4(C). On the other hand, in a second case, the write command $\overline{WE}$ remains low even after the minimum hold time $t_H(min)$ elapses from the rising edge of the clock signal CLK as indicated by the broken line 2 in FIG. 4(C) or the write command $\overline{WE}$ becomes low immediately after the minimum hold time $t_H(min)$ in the read cycle.

The internal write pulse signal SC1 is formed by the write pulse generating circuit 9 which is triggered by the low-level write command $\overline{WE}$ entered at the rising edge of the clock signal CLK. This internal write pulse signal SC1 is applied to the bases of transistors $Q_{82}$ and $Q_{84}$ of the write control circuit 8 as described before.

The input latch circuits 6 and 7 are provided to enter the write data DIN at the rising edge of the clock signal CLK, and the write data DIN is latched during the high-level period of the clock signal CLK while the write data DIN is passed as it is during the low-level period of the clock signal CLK.

In the first and second cases described above, the write data DIN is entered in the write mode responsive to the low-level write command $\overline{WE}$. However, when the transistor Qa carries out a clamp operation responsive to the high-level write command $\overline{WE}$, the potentials at the nodes A2 and B2 become fixed through mutually different courses between the first and second cases. In the synchronous RAM, the external write command $\overline{WE}$ need only become high or low for a predetermined time before and after the rising edge of the clock signal CLK, and the write command $\overline{WE}$ may otherwise change and become low when the write data DIN changes or become low in the read cycle, for example. As a result, the more use of the transistor Qa to carry out a clamping operation responsive to the write command $\overline{WE}$ cannot eliminate the source of the noise, and the clamping cannot be carried out in the read mode.

In other words, in the first case, a preparation takes place for the clamping operation of the transistor Qa when the write command $\overline{WE}$ changes to the high level immediately after the minimum hold time $t_H(min)$ of the input latch circuit 6, and the latch circuit 7 enters the clamping potential at the falling edge of the clock signal CLK which occurs thereafter. As a result, the write process signals Sa3 and Sb3 at the respective nodes A2 and B2 become fixed potentials. Because the write command $\overline{WE}$ remains at the high level even in the read cycle, the change in the write data DIN is not transmitted to the nodes A2 and B2 inside the RAM. Hence, in the first case where the write command $\overline{WE}$ becomes low only in the write mode as in the case of the conventional asynchronous RAM described before in conjunction with FIGS. 1 and 2(A) through 2(F), it is possible to eliminate the source of the noise by use of the transistor Qa.

But in the second case, the driving of the transistor Qa initiated by the change of the write command $\overline{WE}$ to the high level from the low level is only carried out immediately (that is, the minimum set up time $t_S(min)$) before the rising edge of the clock signal CLK in the read cycle. For this reason, when the write command $\overline{WE}$ changes in a state where the clock signal CLK is low (that is, the input latch circuit 7 passes the write data DIN as it is) and the write command $\overline{WE}$ is low (that is, no clamping operation is carried out), the noise source N2 is transmitted to the nodes A2 and B2 thereby changing the potentials of the write process signals Sa4 and Sb4. Furthermore, since the write command $\overline{WE}$ becomes low and the clock signal CLK becomes low at the latter half of the read cycle, the next change in the write data DIN is transmitted to the inside of the RAM as a noise source N3.

Accordingly, although it is possible to eliminate the noise by use of the transistor Qa in the p first case, the transistor Qa is ineffective in the second case where the write command $\overline{WE}$ also becomes low during a time other than the predetermined time described above. Hence, in the second case, the change in the write data DIN is transmitted to the memory cell array as the noise source N2 or N3, and there are problems in that the memory cell may become destroyed or an erroneous write operation may be carried out.

SUMMARY OF THE INVENTION

Accordingly, it is a general object of the present invention to provide a novel and useful semiconductor memory device in which the problems described above are eliminated.

Still another object of the present invention is to provide a synchronous semiconductor memory device having a noise preventing part for preventing a noise from being transmitted to a memory cell array, where the noise is caused by a change in a rite data. According to the semiconductor memory device of the present invention, it is possible to prevent an information content of a memory cell of the memory cell array from being destroyed and also prevent an erroneous write operation.

Another object of the present invention is to provide a synchronous semiconductor memory device comprising a first latch circuit for latching a write command in synchronism with a clock signal, a second latch circuit for latching a write data in synchronism with the clock signal and for outputting two write process signals based on the write data latched thereby, a pulse generating part for generating an internal write pulse signal based on the write command latched by the first latch circuits, where the internal write pulse signal has a first logic level only in a write mode of the synchronous semiconductor memory device, a write control part supplied with the internal write pulse signal and the write process signals for controlling write and read operations of the synchronous semiconductor memory device, a memory part for storing the write data latched by the second latch circuit, and a noise preventing part coupled to the second latch circuit and the write control part for supplying the write process signals to the write control part only in the write mode responsive to the internal write pulse signal and for setting the write process signals to fixed potentials during a time other than the write mode. According to the semiconductor memory device of the present invention, it is possible to prevent undesirable effects on the memory part caused by a noise which is generated by a change in the write data, because the write process signals are fixed during the time other than the write mode.

Other objects and further features of the present invention will be apparent from the following detailed description when read in conjunction with the accompanying drawings.

BRIEF DESCRIPTION OF THE DRAWINGS

FIG. 8 is a circuit diagram showing an embodiment of a write pulse generating circuit within the semiconductor memory device shown in FIG. 6; and FIGS. 9(A) through 9(F) are timing charts for explaining the operation of the write pulse generating circuit shown in FIG. 8.

DETAILED DESCRIPTION

Figure 5:
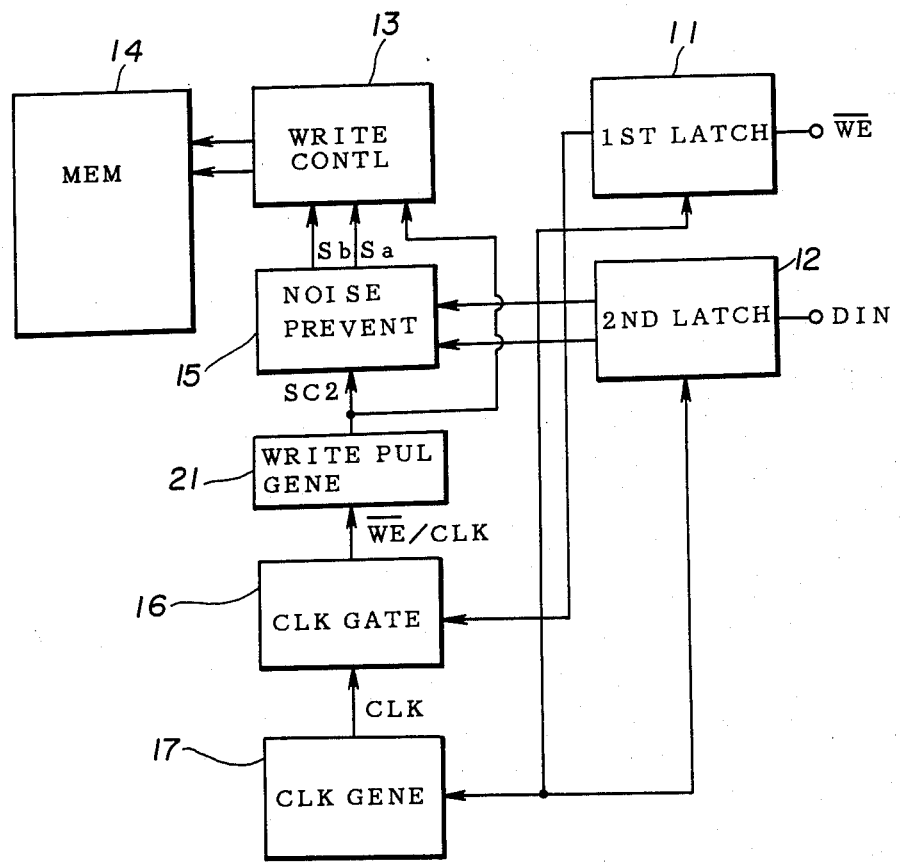
FIG. 5 is a system block diagram showing an embodiment of a semiconductor memory device according to the present invention.

FIG. 5 shows an embodiment of a semiconductor memory device according to the present invention. The semiconductor memory device generally has first and second latch circuits 11 and 12, a write control part 13, a memory part 14, a noise preventing part 15, a clock gate part 16, a clock generating part 17, and a write pulse generating circuit 21. The first latch circuit 11 latches a write command $\overline{WE}$, and the second latch circuit 12 latches a write data DIN. The write control part 13 controls the write and read operations of the semiconductor memory device, and the memory part 14 stores the write data DIN latched by the second latch circuit 12. The noise preventing part 15 is coupled between the second latch circuit 12 and the write control part 13, and the noise preventing part 15 supplies to the write control part 13 the latched write data DIN as write process signals Sa and Sb only in a write mode responsive to an internal write pulse signal SC2 which is formed by the write pulse generating circuit 21 based on a clock signal CLK and the write command $\overline{WE}$. The noise preventing part 15 otherwise sets the write process signals Sa and Sb to fixed potentials.

Figure 4:
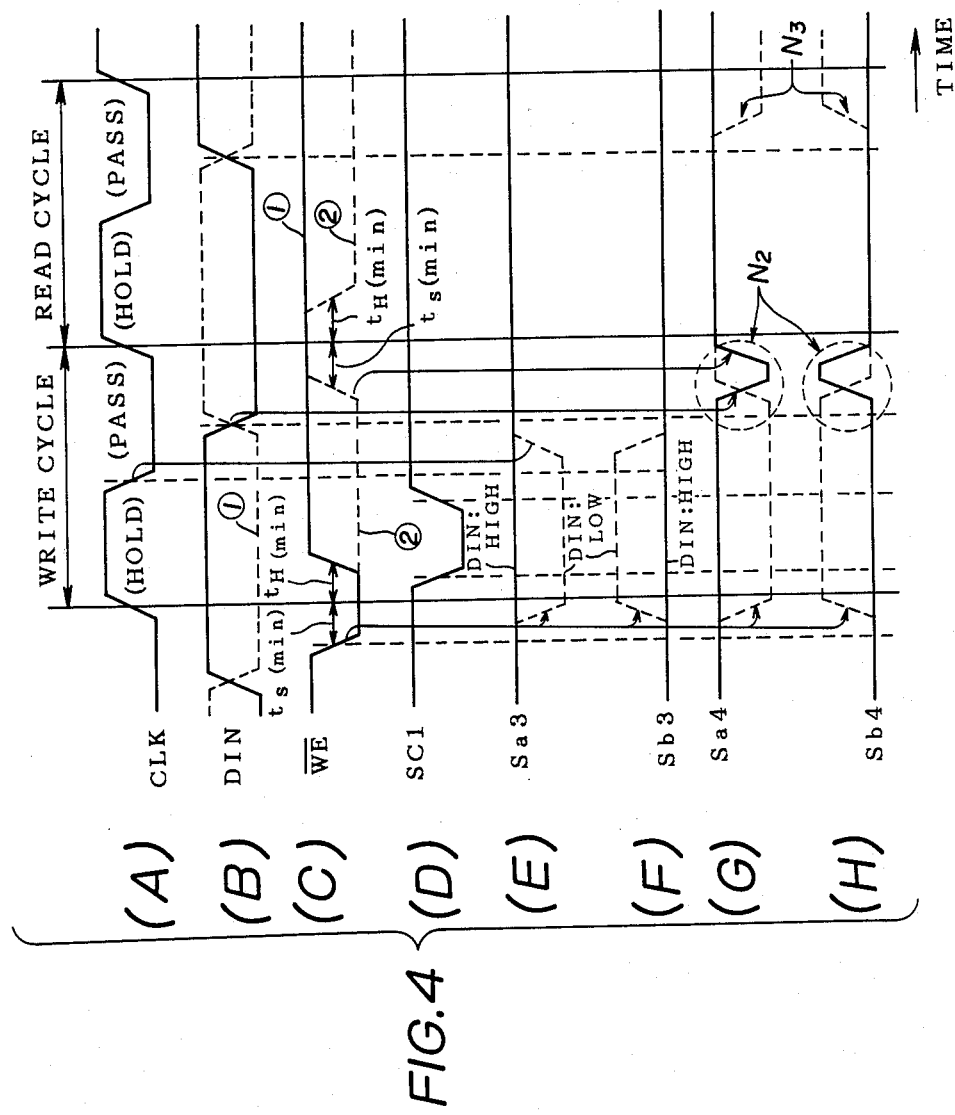
FIGS. 4(A) through 4(H) are timing charts for explaining the operation of the conceivable synchronous RAM shown in FIG. 3.

According to this embodiment, the noise preventing part 15 carries out a control by the internal write pulse signal SC2 formed from the write command $\overline{WE}$ and the clock signal CLK, so that the write process signals Sa and Sb supplied to the write control part 13 are clamped at the output side of the second latch circuit 12 and the potentials of the write process signals Sa and Sb are fixed. For this reason, it is possible to prevent the noise which cannot be eliminated by use of the transistor Qa from being transmitted to the write control part 13. This noise which is prevented from being transmitted to the write control part 13 is caused by the change in the write data DIN which occurs before the set up time immediately before the read cycle or during the read cycle as shown in FIG. 4(B).

Therefore, according to this embodiment, it is possible to eliminate the problems of the information content of the memory cell becoming destroyed and an erroneous write operation being carried out because of the noise.

Figure 6:
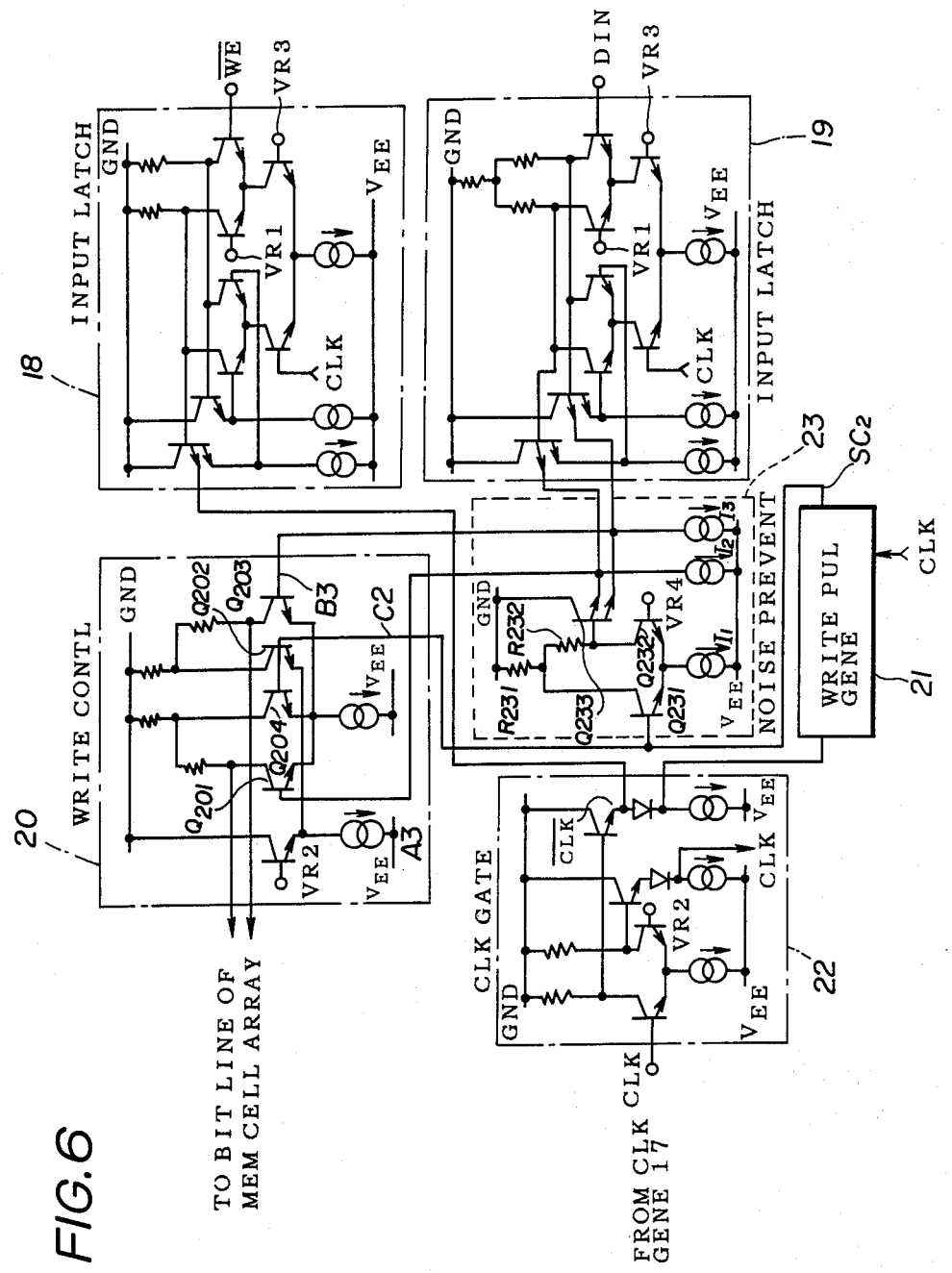
FIG. 6 is a circuit diagram showing the embodiment shown in FIG. 5.

FIG. 6 is a circuit diagram of the embodiment shown in FIG. 5. The semiconductor memory device shown in FIG. 6 is a synchronous RAM. A write command input latch circuit 18 corresponds to the first latch circuit 11, a write data input latch circuit 19 corresponds to the second latch circuit 12, a write control circuit 20 corresponds to the write control part 13, a clock gate circuit 22 corresponds to the clock gate part 16, and a noise preventing circuit 23 corresponds to the noise preventing part 15. The illustration of the memory part 14 and the clock generating part 17 is omitted in FIG. 6. $V_{EE}$ denotesaa power source voltage, and VR1 through VR4 denote reference voltages.

Figure 7:
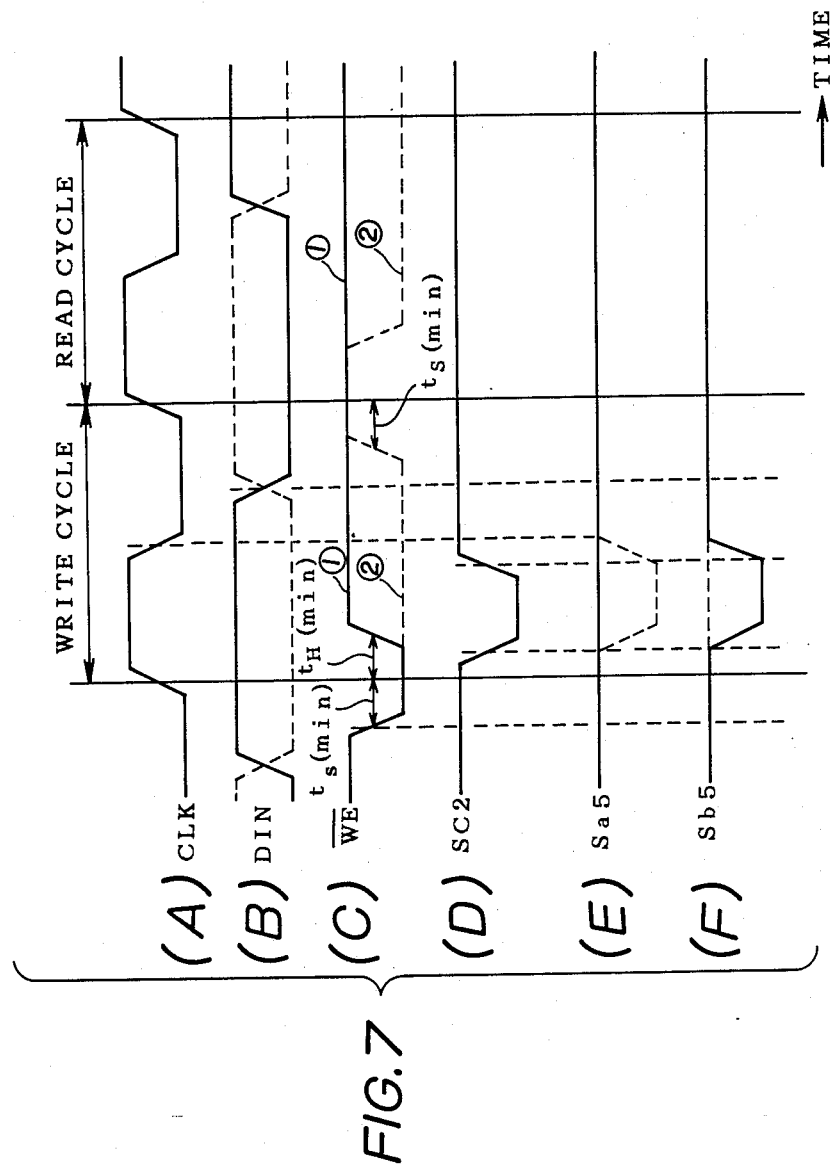
FIGS. 7(A) through 7(F) are timing charts for explaining the operation of the embodiment shown in FIG. 6.

The input latch circuits 18 and 19 respectively enter the write command $\overline{WE}$ and the write data DIN at the rising edge of the clock signal CLK, hold the write command $\overline{WE}$ and the write data DIN during the high-level period of the clock signal CLK, and pass the write command $\overline{WE}$ and the write data DIN as they are during the low-level period of the clock signal CLK. FIGS. 7(A) through 7(F) are timing charts for explaining the operation of the synchronous RAM shown in FIG. 6. FIGS. 7(A), 7(B) and 7(C) respectively show the clock signal CLK, the write data DIN and the write command $\overline{WE}$.

Figure 1:
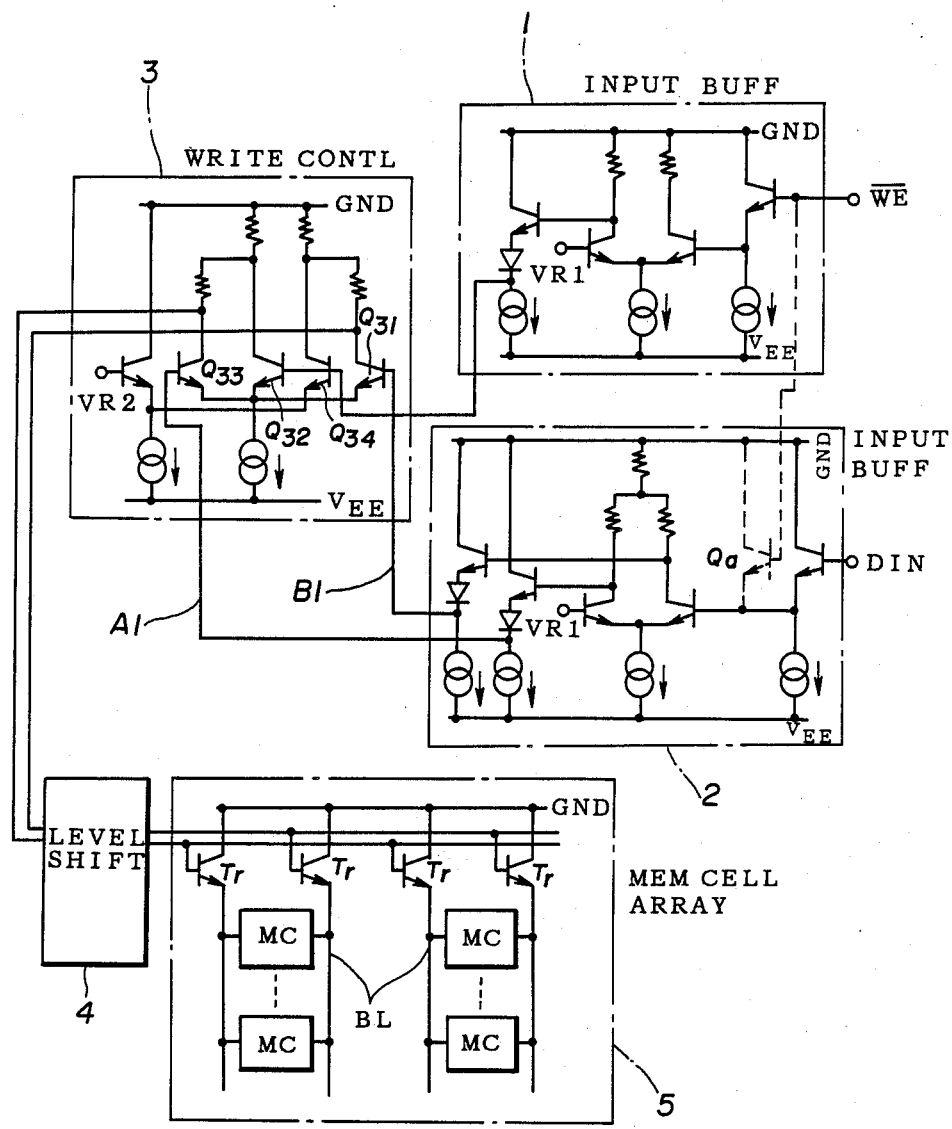
FIG. 1 is a circuit diagram showing an example of a conventional asynchronous RAM.
Figure 2:
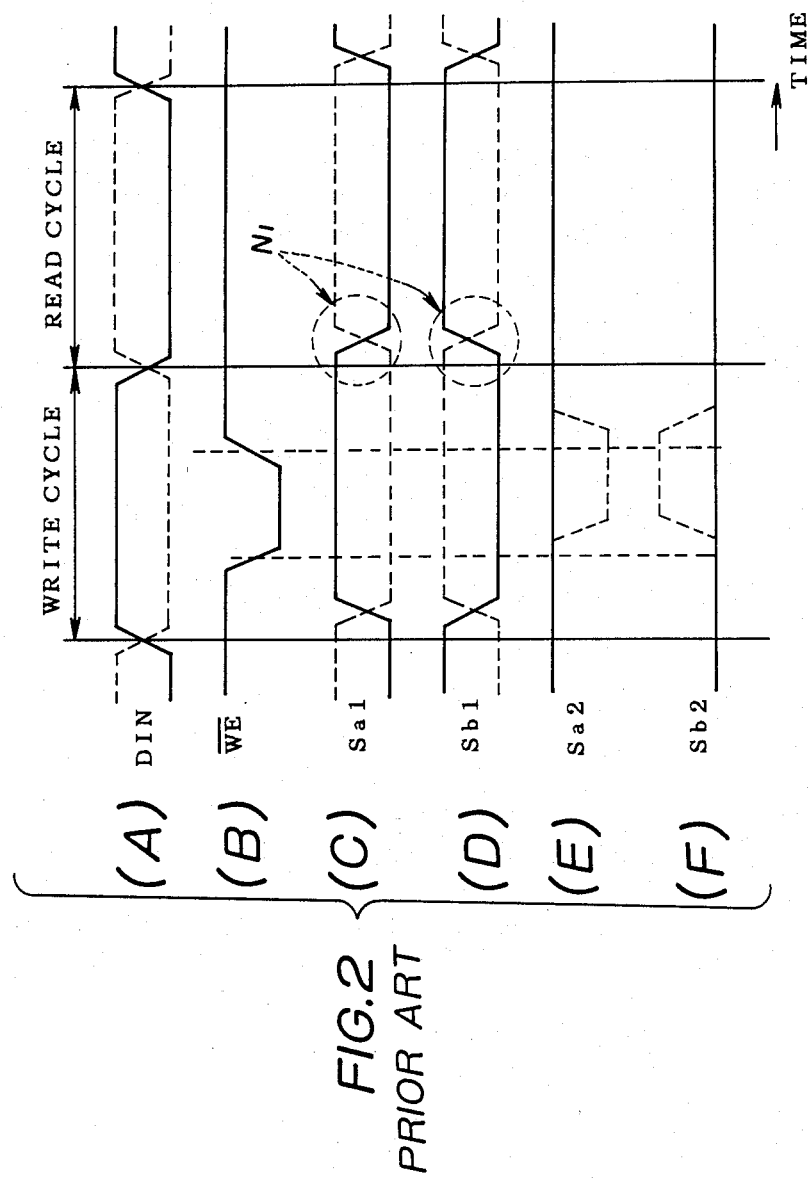
FIGS. 2(A) through 2(F) are timing charts for explaining the operation of the conventional asynchronous RAM shown in FIG. 1.

The write control circuit 20 supplies the write data DIN to the transistor of the memory cell array as in the case of the conventional RAM shown in FIG. 1 in the write mode, and cuts off the supply of the write data DIN to apply a constant read potential to the transistor (Tr in FIG. 1) of the memory cell array in the read mode. The write pulse generating circuit 21 generates an internal write pulse signal SC2. The clock gate circuit 22 supplies to the write pulse generating circuit 21 a start signal for starting the generation of the internal write pulse signal SC2 based on the clock signal CLK from the clock generating part (not shown) and the write command $\overline{WE}$. In this embodiment, the clock gate circuit 22 generates the start signal by obtaining a logical sum of the write command $\overline{WE}$ and an inverted signal of the clock signal CLK.

The noise preventing circuit 23 constitutes an essential part of this embodiment. The noise preventing circuit 23 has npn transistors $Q_{231}$ and $Q_{232}$, a transistor $Q_{233}$ having a multi-emitter structure, constant current sources $I_1$ through $I_3$, and resistors $R_{231}$ and $R_{232}$.

The internal write pulse signal SC2 from the write pulse generating circuit 21 is applied to a base of the transistor $Q_{231}$, and the reference voltage VR4 is applied to a base of the transistor $Q_{232}$. A difference voltage between outputs of the two transistors $Q_{231}$ and $Q_{232}$ is divided by the bias resistor $R_{231}$ and the load resistor $R_{232}$ and is applied to a base of the transistor $Q_{233}$, so as to control write process signals Sa5 and Sb5 which are outputted from the input latch circuit 19. The internal write pulse signal SC2 is shown in FIG. 7(D), and the write process signals Sa5 and Sb5 are respectively shown in FIGS. 7(E) and 7(F).

A node A3 is connected to a base of a transistor $Q_{201}$ of the write control circuit 20 for receiving the write process signal Sa5, and a node B3 is connected to a base of a transistor $Q_{203}$ of the write control circuit 20 for receiving the write process signal Sb5. A node C2 is connected to bases of transistors $Q_{202}$ and $Q_{204}$ of the write control circuit 20 for receiving the internal write pulse signal SC2.

FIG. 8 shows an embodiment of the write pulse generating circuit 21. An OR gate 100 is a part of the clock gate circuit 22 at the output portion thereof. The write pulse generating circuit 21 has a delay element group 101 for introducing a time delay td1, a wired OeR gate 102, a delay element group 103 for introducing a time delay td2, and an RS flip-flop 104 which are connected as shown. An inverted clock signal $\overline{CLK}$ and a write command $\overline{WE}$ respectively shown in FIGS. 9(A) and 9(B) are supplied to the OR gate 100. A signal shown in FIG. 9(C) is obtained at a node A on an output side of the OR gate 100, and a pulse signal shown in FIG. 9(D) is obtained at a node B on an output side of the OR gate 102. A pulse signal shown in FIG. 9(E) is obtained at a node C on an output side of the delay element group 103.

The pulse signals at the nodes B and C are respectively supplied to a set terminal S and a reset terminal R of the flip-flop 104. Hence, an internal write pulse signal SC2 shown in FIG. 9(F) is outputted from the flip-flop 104 and is supplied to the noise preventing circuit 23 and the write control circuit 20 shown in FIG. 6 through an output terminal 105.

Next, a description will be given of the noise cancelling operation of the synchronous RAM shown in FIG. 6 by referring to FIGS. 7(A) through 7(F). $t_S(min)$ denotes a minimum set up time and $t_H(min)$ denotes a minimum hold time of the input latch circuit 18.

First, in the write cycle, the low-level write command $\overline{WE}$ is entered into the input latch circuit 18 at the rising edge of the clock signal CLK, and the low level of the write command $\overline{WE}$ is held during the high-level period of the clock signal CLK. Accordingly, the output signal of the input latch circuit 18 changes from the high level to the low level. At the same time, the clock signal CLK is also entered in the clock gate circuit 22, and the start signal which is a logical sum of the output signal of the input latch circuit 18 and an inverted signal $\overline{CLK}$ of the clock signal CLK is supplied to the write pulse generating circuit 21. The write pulse generating circuit 21 is triggered by the output start signal of the clock gate circuit 22 and outputs the internal write pulse signal SC2 having a low level for a predetermined time (width).

During the time in which the internal write pulse signal SC2 has the low level, the transistor $Q_{231}$ is OFF and the signal level at a base of the transistor $Q_{233}$ becomes low, thereby cancelling the clamping operation. As a result, during the low-level period of the internal write pulse signal SC2, the write data DIN held by the input latch circuit 19 is transmitted to the write control circuit 20 as the write process signals Sa5 and Sb5. The transistors $Q_{202}$ and $Q_{204}$ are both OFF due to the low-level internal write pulse signal SC2, and the transistors $Q_{201}$ and $Q_{203}$ respectively become ON and OFF or vice versa responsive to the complementary write process signals Sa5 and Sb5. The signal levels at the collectors of the transistors $Q_{201}$ and $Q_{203}$ are transmitted to the transistor at the bit lines of the memory cell array (not shown).

When the internal write pulse signal SC2 returns to the high level, the transistor $Q_{231}$ thereafter becomes ON and the signal level at the base of the transistor $Q_{233}$ becomes high. The write process signals Sa5 and Sb5 at the respective nodes A3 and B3 are both clamped to the high level.

In this case, even when the write command $\overline{WE}$ changes as indicated by a broken line 2 in FIG. 7(C), the noise due to the change in the data DIN will not be transmitted inside the synchronous RAM as in the conceivable synchronous RAM because the write process signals Sa5 and Sb5 at the respective nodes A3 and B3 are actually clamped to the high level by the internal write pulse signal SC2 generated within the synchronous RAM.

Figure 3:
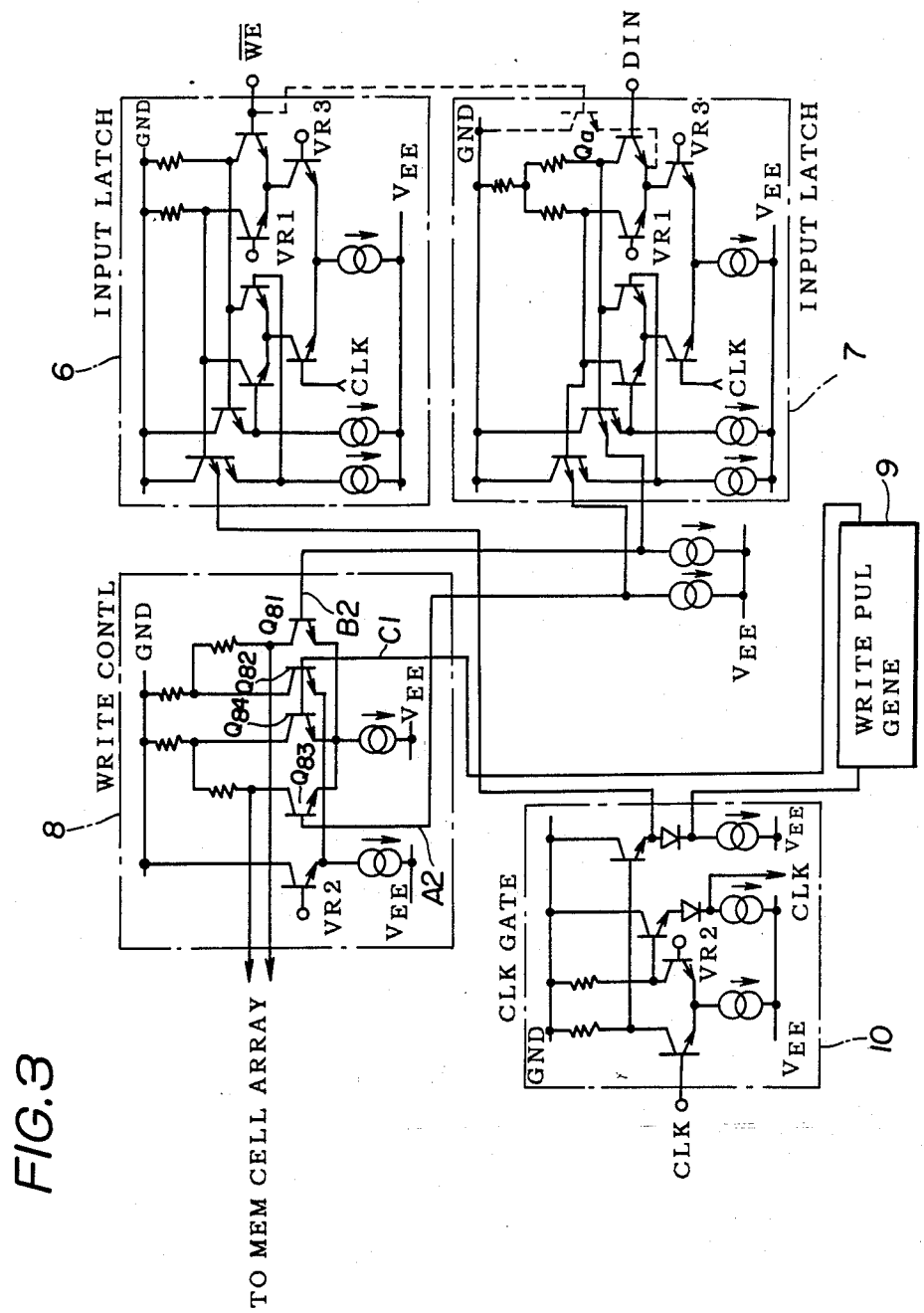
FIG. 3 is a circuit diagram showing a conceivable synchronous RAM.

In addition, the fact that the clamping operation is carried out at the output stage of the input latch circuit 19 is also an important feature of the present invention for the following reasons. That is, the synchronous RAM is designed so that the write data DIN is entered and held at the rising edge of the clock signal CLK. For this reason, when the clamping operation is carried out at the input stage of the input latch circuit 19 similarly as in the case of the conceivable synchronous RAM shown in FIG. 3 having the transistor Qa, it becomes impossible to enter the write data DIN at the rising edge of the clock signal CLK.

Next, in the read cycle, the input latch circuit 18 enters and holds the high-level write command $\overline{WE}$ at the rising edge of the clock signal CLK. Hence, the write pulse generating circuit 21 outputs the internal write pulse signal SC2 with the level thereof kept to the high level. Accordingly, the transistor $Q_{231}$ becomes ON and the signal level at the base of the transistor $Q_{233}$ becomes high, thus clamping the output signals of the input latch circuit 19 to the high level. Therefore, the write process signals Sa5 and Sb5 are both clamped to the high level, and even when the write command $\overline{WE}$ thereafter changes to the low level, the change in the write data DIN will not be transmitted inside the synchronous RAM. The transistors $Q_{202}$ and $Q_{204}$ become ON responsive to the high-level internal write pulse signal SC2, and the output signals of the write control circuit 20 are controlled to a predetermined read reference level.

Further, the present invention is not limited to these embodiments, but various variations and modifications may be made without departing from the scope of the present invention.

What is claimed is:

1. A synchronous semiconductor memory device comprising:
   first latch means for latching a write command in synchronism with a clock signal;
   second latch means for latching a write data in synchronism with the clock signal and for outputting two write process signals based on the write data latched thereby;
   pulse generating means for generating an internal write pulse signal based on the write command latched by said first latch means, said internal write pulse signal having a first logic level only in a write mode of the synchronous semiconductor memory device;
   write control means supplied with said internal write pulse signal and said write process signals for controlling write and read operations of the synchronous semiconductor memory device;
   memory means for storing the write data latched by said second latch means; and
   noise preventing means coupled to said second latch means and said write control means for supplying said write process signals to said write control means only in the write mode responsive to said internal write pulse signal and for setting said write process signals to fixed potentials during a time other than the write mode.

2. A synchronous semiconductor memory device as claimed in claim 1 in which said write control means supplies the write data latched by said second latch means to said memory means in the write mode and cuts off the supply of the write data to said memory means in a read mode of the synchronous semiconductor memory device so as to apply a constant read potential to said memory means.

3. A synchronous semiconductor memory device as claimed in claim 1 in which said first and second latch means respectively latch the write command and the write data at a transition of the clock signal from the first logic level to a second logic level, hold the write command and the write data during a time when the clock signal has the first logic level, and pass the write command and the write data as they are during a time when the clock signal has the second logic level.

4. A synchronous semiconductor memory device as claimed in claim 1 in which said pulse generating means includes a clock gate circuit supplied with the clock signal and the write command latched by said first latch means for outputting a start signal which is a logical sum of the write command and an inverted signal of the clock signal, and a write pulse generating circuit for outputting said internal write pulse signal based on the clock signal responsive to the start signal from said clock gate circuit.

5. A synchronous semiconductor memory device as claimed in claim 1 in which said noise preventing means has a clamp circuit for clamping the write process signals to a second logic level during a time when said internal write pulse signal has the second logic level and for cancelling the clamping of the write process signals during a time when said internal write pulse signal has the first logic level.

6. A synchronous semiconductor memory device as claimed in claim 1 in which said write command has a first transition from a second logic level to the first logic level a set up time before a transition of the clock signal from the first logic level to the second logic level and a second transition from the first logic level to the second logic level after a hold time from said transition of the clock signal and at least the set up time before a next transition of the clock signal from the first logic level to the second logic level, said set up time and said hold time being set up and hold times of said first latch means.

7. A synchronous semiconductor memory device as claimed in claim 6 in which said internal write pulse signal has the first logic level only for a predetermined time, said predetermined time being a sum of said set up time and said hold time.

8. A synchronous semiconductor memory device as claimed in claim 1 in which said internal write pulse signal has the first logic level only for a predetermined time.

9. A synchronous semiconductor memory device as claimed in claim 1 in which said noise preventing means transmits the write data latched by said second latch means to said write control means as the write process signals in the write mode when the internal write pulse signal has the first logic level and clamps the write process signals to a second logic value in a read mode when the internal write pulse signal has the second logic level.

* * * * *